(12) United States Patent
Hayashi et al.

(10) Patent No.: US 9,337,234 B2
(45) Date of Patent: May 10, 2016

(54) PHOTOELECTRIC CONVERTER, PHOTOELECTRIC CONVERTER ARRAY AND IMAGING DEVICE

(71) Applicants: Yutaka Hayashi, Tsukuba (JP); Toshitaka Ota, Tsukuba (JP); Yasushi Nagamune, Tsukuba (JP); Hirofumi Watanabe, Miki (JP); Takaaki Negoro, Kishiwada (JP); Kazunari Kimino, Nishinomiya (JP)

(72) Inventors: Yutaka Hayashi, Tsukuba (JP); Toshitaka Ota, Tsukuba (JP); Yasushi Nagamune, Tsukuba (JP); Hirofumi Watanabe, Miki (JP); Takaaki Negoro, Kishiwada (JP); Kazunari Kimino, Nishinomiya (JP)

(73) Assignees: NATIONAL INSTITUTE OF ADVANCED INDUSTRIAL SCIENCE AND TECHNOLOGY, Tokyo (JP); RICOH COMPANY, LTD., Tokyo (JP)

(*) Notice: Subject to any disclaimer, the term of this patent is extended or adjusted under 35 U.S.C. 154(b) by 142 days.

(21) Appl. No.: 14/349,414

(22) PCT Filed: Oct. 5, 2012

(86) PCT No.: PCT/JP2012/076557
§ 371 (c)(1),
(2) Date: Apr. 3, 2014

(87) PCT Pub. No.: WO2013/051734
PCT Pub. Date: Apr. 11, 2013

(65) Prior Publication Data
US 2014/0239158 A1  Aug. 28, 2014

(30) Foreign Application Priority Data

Oct. 6, 2011 (JP) ................................. 2011-222020

(51) Int. Cl.
| | |
|---|---|
| *H01L 27/146* | (2006.01) |
| *H04N 5/3745* | (2011.01) |
| *H04N 5/378* | (2011.01) |
| *H01L 27/144* | (2006.01) |

(52) U.S. Cl.
CPC ...... *H01L 27/14681* (2013.01); *H01L 27/1443* (2013.01); *H01L 27/14609* (2013.01); *H01L 27/14656* (2013.01); *H04N 5/378* (2013.01); *H04N 5/3745* (2013.01)

(58) Field of Classification Search
CPC .............. H01L 27/14681; H01L 27/1443; H01L 27/14609; H01L 27/14656; H04N 5/3745; H04N 5/378
USPC ........................................................ 250/208.1
See application file for complete search history.

(56) References Cited

U.S. PATENT DOCUMENTS

| | | | |
|---|---|---|---|
| 4,866,293 A | 9/1989 | Nakamura et al. | |
| 6,940,551 B2* | 9/2005 | Merrill | H04N 5/363 348/241 |
| 6,946,637 B2* | 9/2005 | Kochi | H01L 27/14609 250/208.1 |
| 2010/0134648 A1 | 6/2010 | Funatsu et al. | |
| 2011/0128428 A1 | 6/2011 | Takatoku et al. | |
| 2011/0242379 A1 | 10/2011 | Kato et al. | |

FOREIGN PATENT DOCUMENTS

| | | |
|---|---|---|
| CN | 102209211 A | 10/2011 |
| CN | 102209211 A | 10/2011 |
| JP | 47-18561 | 5/1972 |
| JP | 60-14231 | 1/1985 |
| JP | 63-175467 | 7/1988 |
| JP | 1-288181 | 11/1989 |
| JP | 2009-141419 | 6/2009 |
| JP | 2011-40917 | 2/2011 |
| JP | 2011-135561 | 7/2011 |

OTHER PUBLICATIONS

International Search Report issued on Nov. 6, 2012 in PCT/JP2012/076557 filed on Oct. 5, 2012.
Japanese official action dated Dec. 20, 2011 in corresponding Japanese Patent Application No. 2008-98345.

Japanese official action dated Sep. 15, 2015 in corresponding Japanese Patent Application No. 2011-222020.
European search report dated Jun. 5, 2015 in connection with European patent application No. 12838682.8.

* cited by examiner

*Primary Examiner* — Seung C Sohn
(74) *Attorney, Agent, or Firm* — Cooper & Dunham LLP

(57) ABSTRACT

A photoelectric converter includes a first pn junction comprised of at least two semiconductor regions of different conductivity types, and a first field-effect transistor including a first source connected with one of the semiconductor regions, a first drain, a first insulated gate and a same conductivity type channel as that of the one of the semiconductor regions. The first drain is supplied with a second potential at which the first pn junction becomes zero-biased or reverse-biased relative to a potential of the other of the semiconductor regions. When the first source turns to a first potential and the one of the semiconductor regions becomes zero-biased or reverse-biased relative to the other semiconductor regions, the first pn junction is controlled not to be biased by a deep forward voltage by supplying a first gate potential to the first insulated gate, even when either of the semiconductor regions is exposed to light.

13 Claims, 6 Drawing Sheets

PHOTOELECTRIC CONVERTER, PHOTOELECTRIC CONVERTER ARRAY AND IMAGING DEVICE

CROSS REFERENCE TO RELATED APPLICATION

The present application is based on and claims priority from Japanese Patent Application No. 2011-222020, filed on Oct. 6, 2011, the disclosure of which is hereby incorporated by reference in its entirety.

TECHNICAL FIELD

The present invention relates to improved photoelectric converters to convert optical information as optical intensity and wavelength and so on and an optical image into current, charge, voltage, or electric information including digital data, as well as to photoelectric conversion cells, photoelectric converter arrays comprised of the photoelectric conversion cells as the photoelectric converters and imaging devices incorporating such an array.

BACKGROUND ART

A photocurrent flows through one end of a first pn junction with a photoelectric conversion function in an electrically floating state and is accumulated as charge for a certain period of time or accumulated charges are discharged by the photocurrent as will be described later. To detect a result of this as an electric signal, generally, the electric capacitance connected with said one end of the first pn junction is excessively charged or discharged if optical intensity is large relative to accumulation time or integral time. This makes the photocurrent flow forward in the first pn junction. As a result, the first pn junction is biased by a deep forward voltage and excess minority carriers are accumulated in the two semiconductor regions of opposite conductivity types forming the first pn junction. This causes a problem that response speed is degraded because of a delay due to so-called saturation time taken for switching the first pn junction to a reverse bias associated with the lifetime of minority carriers. This phenomenon is called a saturation effect.

Japanese Patent Publication No. S47-18561 discloses a technique in which the pn junction is connected in parallel with Schottky junction, in order to prevent the pn junction from being biased by a deep forward voltage. The pn junction can be prevented from being deeply biased because a forward voltage is smaller at the Shottky junction than at the pn junction so that most currents flow into the Shottky junction. However, reverse currents at the Shottky junction are several orders of magnitude larger than at the pn junction, which increases the total amount of dark currents. Because of this, this technique cannot be adopted for a high-sensitive photoelectric converter.

Herein, the first pn junction biased by a deep forward voltage refers to the forward voltage at the first pn junction when all the photocurrents flow therein as a forward current. If the amount of the photocurrents flowing as the forward current is reduced to one-tenth or less to decrease the saturation time to about one-tenth, the saturation problem is considered to be solved. In this case the forward voltage at the first pn junction is smaller than that in the deeply biased state by 2.3 kT/q (about 60 mV at room temperature). Herein, under the ambient condition in which the pn junction becomes biased by the deep forward voltage if left uncontrolled, the control over the pn junction to be maintained in zero bias or reverse bias state and to have the forward voltage smaller than this deep forward voltage by 2.3 kT/q is referred to as saturation control, where k is Bolzman constant, T is absolute temperature of the photoelectric converter, and q is elementary charge of electron.

If the first pn junction is formed of a first semiconductor region of a first conductivity type and a second semiconductor region of a second conductivity type opposite to the first conductivity type adjacent thereto, accumulated excess minority carriers are spread from the first pn junction within the diffusion length of minority carriers in both of the first and second semiconductor regions. The diffusion lengths differ depending on the type of carriers, electron or hole, or the electric characteristics of the semiconductor regions and the diffusion lengths between the first and second semiconductor regions are different.

Further, with a second pn junction having a photoelectric conversion function additionally provided in the diffusion length, currents flow in the second pn junction even if the second pn junction is not exposed to light, causing the photoelectric converter to malfunction. This leads to image blurs and equivalently degraded resolution in an imaging device comprising a photoelectric converter array in which photoelectric conversion elements as the pn junctions are arranged in the first semiconductor region.

Now, referring to FIG. 1, using a photodiode as an example of a photoelectric conversion element, how to convert optical information as optical intensity and wavelength components into electric information for output is described. FIG. 1 shows a photodiode 1000a as the first pn junction having an anode 1002a and a field effect transistor 3000a operating as a switch, in which the anode 1002a is connected with the source or drain of the field effect transistor 3000a. The field-effect transistor 3000a switches off the anode 1002a of the photodiode 1000a to place it in a floating state during accumulation time in order to temporarily accumulate photocurrents in the electric capacitance associated with the photoelectric conversion element (in this case, anode-cathode electric capacitance) and switches it on to output accumulated charges as current or charge.

First, the field effect transistor 3000a is switched on so that one end (anode 1002a in the drawing) of the photodiode 1000a is at a Vref potential and the anode-cathode electric capacitance of the photodiode 1000a is charged with a Vdd-Vref voltage. Vdd is a power supply voltage and Vref is a read reference voltage.

Next, the field effect transistor 3000a is switched off and the photoelectric conversion element is illuminated with light. Then, a photocurrent separately generated at the pn junction flows into the anode-cathode electric capacitance Canc from the anode 1002a of the photodiode 1000a and the capacitance charged with Vdd-Vref alone is discharged. Thereby, a cathode potential rises towards the power supply voltage Vdd. Thus, the anode-cathode electric capacitance is discharged by the photocurrent in reality. However, it may be expressed herein that a photocurrent is stored as a charge for convenience.

With a long switch-off time or a large photocurrent, the anode 1002a of the photodiode 1000a exceeds Vdd and reaches a forward potential. The forward potential continues to rise and reaches the maximum value when all the photocurrents flow through between the anode and cathode of the photodiode 1000a. This is referred to as "biased by a deep forward voltage". In this state excess minority carriers are stored in the semiconductor regions of the photodiode 1000a, causing a delay in switching the photodiode 1000a to a reverse bias direction.

DISCLOSURE OF THE INVENTION

An object of the present invention is to provide a photoelectric converter which prevents a first pn junction with a photoelectric conversion function from being placed in the saturated state in which the first pn junction is biased by the deep forward voltage while controlling a reverse current at the first pn junction not to be as large as that at the Shottky junction. Another object is to provide a photoelectric converter which can prevent image blurs and improve equivalent degradation in resolution.

To solve the above objects, following solutions are provided in the present invention.

(Solution 1)

A photoelectric converter comprises a first pn junction having a photoelectric conversion function and comprised of at least two semiconductor regions of different conductivity types, and a first field-effect transistor including a first source, a first drain, a first insulated gate, the first source connected with one of the semiconductor regions, in which when either of the semiconductor regions is exposed to light, a photocurrent flows in the first pn junction, wherein the first field-effect transistor includes a same conductivity type channel as that of the one of the semiconductor regions, the first drain of the first field-effect transistor is supplied with a second potential at which the first pn junction is zero-biased or reverse-biased relative to a potential of the other of the semiconductor regions, and by supplying, to the first insulated gate, a first-gate potential which makes the first field-effect transistor conductive when the first source reaches a first potential at which the one of the semiconductor regions becomes zero-biased or reverse-biased relative to the other of the semiconductor regions, the photoelectric converter is configured to control saturation of the first pn junction not to be biased by the deep forward voltage, even when either of the two semiconductor regions is exposed to light.

To control the two semiconductor regions of different conductivity types not to be biased by the deep forward voltage by flowing most (90% or more, for example) of the photocurrents to the drain through the source of the first field-effect transistor, the first gate potential needs to be preset under a certain condition.

(Solution 2)

A photoelectric converter according to solution 1, wherein an absolute value of a difference between the first gate potential and the potential of the other of the semiconductor regions is equal to or larger than an absolute value of a gate threshold voltage of the first field-effect transistor.

In case that a photoelectric element for the photoelectric converter of the present invention is a photo-transistor, a following architecture is applied.

(Solution 3)

A photoelectric converter according to solution 1, wherein
the first pn junction is a base-collector junction of a first bipolar transistor; and
the base of the first bipolar transistor is connected with the source of the first field-effect transistor.

Architectures incorporating a second field-effect transistor for selecting the photoelectric converter or reading the stored photoelectric charge or the electric information from it are provided as solutions 4, 5 and 6.

(Solution 4)

A photoelectric converter according to solution 1, further comprising
a second field-effect transistor including a second source, a second drain, and a second gate, wherein
one of the second source and second drain is connected with an anode of the pn junction, and electric information (electric charge or current) is obtained from the other of the second source and second drain, on supplying a conductive signal at the second gate to make the second field-effect transistor conductive.

(Solution 5)

A photoelectric converter according to solution 3, further comprising
a second field-effect transistor including a second source, a second drain, and a second gate, wherein
one of the second source and second drain is connected with an emitter of the first bipolar transistor, and electric information (as electric charge or current) is obtained from the other of the second source and second drain, on supplying a conductive signal at the second gate to make the second field-effect transistor conductive.

(Solution 6)

A photoelectric converter according to solution 3, further comprising
a second field-effect transistor including a second source, a second drain, and a second gate; and
a single or plural second bipolar transistors, wherein
an emitter of the first bipolar transistor is connected with a base of the single or plural bipolar transistors;
a base and an emitter of the plural bipolar transistors are connected with each other;
an emitter not connected with the base is connected with one of the second source and second drain, and electric information (as electric charge or current) is obtained from the other of the second source and second drain, on supplying a conductive signal at the second gate to make the second field-effect transistor conductive.

An example of a structure for the photoelectric converter of the solution 1 is shown as follows.

(Solution 7)

A photoelectric converter comprising:
a first semiconductor region of a first conductivity type;
a second semiconductor region of a second conductivity type opposite to the first conductivity type, in contact with the first semiconductor region;
a third semiconductor region of the second conductivity type, provided in contact with the first semiconductor region and spaced apart from the second semiconductor region;
a first insulator film provided on a surface of the first semiconductor region between the second and third semiconductor region; and
a first gate provided on the first insulator film to bridge the second and third semiconductor region, in which when the second semiconductor region or a part of the first semiconductor region close to the second semiconductor region is exposed to light, a photocurrent flows between the first and second semiconductor regions, wherein
the third semiconductor region is supplied with a second potential at which the second semiconductor region is zero-biased or reverse-biased relative to the first semiconductor region, and when the second semiconductor region turns to a first potential, at which the second semiconductor region becomes zero-biased or reverse-biased relative to the first semiconductor region, the photoelectric converter is configured to control saturation of the second semiconductor region not to be biased by the deep forward voltage by supplying, to the first gate, a first gate potential to induce a channel or a current path on a surface of the first semiconductor region under the first gate, even when the second semiconductor region or a portion of the first semiconductor region close to the second semiconductor region is exposed to light.

To reduce dark current at the junction between the first semiconductor region and the second semiconductor region, the following architecture is provided.

(Solution 8)

A photoelectric converter according to solution 7, further comprising a fourth semiconductor region of the first conductivity type provided to cover an upper part of the second semiconductor region and be self-aligned with the first gate.

In the photoelectric converter of the present invention, an example of the structures for photoelectric conversion elements having an amplification function is provided.

(Solution 9)

A photoelectric converter according to solution 7, further comprising a fifth semiconductor region of the first conductivity type in contact with the second semiconductor region, so that a current having flowed through the second semiconductor region is amplified through the first or fifth semiconductor region.

Examples of array structures for the present photoelectric converter and imaging devices by the present photoelectric converter are provided as follows.

(Solution 10)

A photoelectric converter array comprising:

a plurality of the photoelectric converters according to solution 4, arranged in first and second directions intersecting with each other;

a plurality of first interconnections extending in the first direction;

a plurality of second interconnections extending in the second direction;

a third interconnection to supply the first gate potential; and a fourth interconnection to supply the second potential, wherein:

the first to fourth interconnections are insulated with one another; and the second gate of the second field-effect transistor is connected with one of the first interconnections extending in the first direction; and the other of the second source and second drain of the second field-effect transistor is connected with one of the second interconnections extending in the second direction.

(Solution 11)

A photoelectric converter array according to solution 10, wherein the second drain is arranged to have a common portion in neighboring photoelectric converters.

(Solution 12)

An imaging device comprising:

the photoelectric converter array according to solution 10;

a drive circuit to scan the first interconnections;

a current or charge sense circuit connected with the second interconnections;

a third field-effect transistor for potential setting connected with the second interconnections at one of a source and a drain;

a reference potential supplier connected with the other of the source and drain of the third field-effect transistor;

a first gate potential supplier connected with the third interconnection; and a second potential supplier connected with the fourth interconnection, wherein the current or charge sense circuit is of a differential type, having a first input terminal connected with the second interconnections and a second input terminal, and supplied with a reference potential at the second input terminal.

(Solution 13)

An imaging device according to solution 12, wherein the third field-effect transistor is configured to supply a reference potential to the second interconnections after the sense circuit completes sensing and before the second field-effect transistor is turned off.

BRIEF DESCRIPTION OF THE DRAWINGS

Features, embodiments, and advantages of the present invention will become apparent from the following detailed description with reference to the accompanying drawings.

DESCRIPTION OF THE EMBODIMENTS

Hereinafter, embodiments of the present invention will be described in detail with reference to the accompanying drawings. Wherever possible, the same reference numbers will be used throughout the drawings to refer to the same or like parts.

First Embodiment

Figure 1:
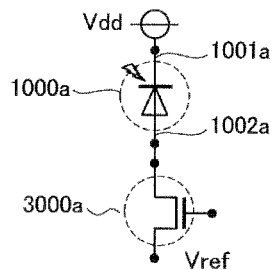
FIG. 1 shows a related art photodiode with a switch.
Figure 2:
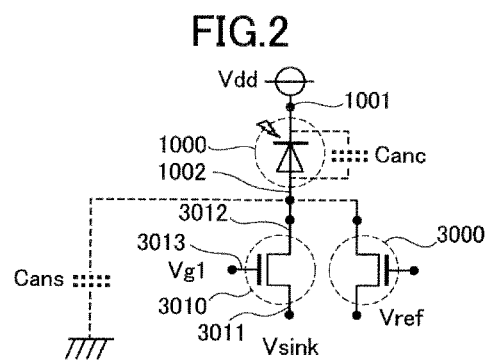
FIG. 2 is an exemplary circuit diagram comprising a photodiode with a first field-effect transistor according to one embodiment of the present invention.

FIG. 2 is a circuit diagram including first and second field effect transistors 3010, 3000 and a photodiode 1000 as a first pn junction according to a first embodiment. In FIG. 2 the photodiode 1000 is connected at an anode 1002 with one of the drain and source of the second field effect transistor 3000 as well as with a first source 3012 of the first field-effect transistor 3010. The first field-effect transistor 3010 is a saturation controlling transistor and the second field-effect transistor 3000 is a switching transistor. The first field-effect transistor 3010 is a p-channel type and comprises the first source 3012, a first drain 3011, and a first gate 3013 in the present embodiment.

In the drawing a cathode potential Vdd is more positive than a read reference potential Vref. The first gate 3013 of the first field-effect transistor is supplied with a first gate potential Vg1, the first drain 3011 thereof is supplied with a potential Vsink which is equal to the cathode potential Vdd or closer to Vref than Vdd. That is, Vsink is a second potential which reversely biases or zero-biases the first pn junction. A first gate potential Vg1 is equal to Vdd+Vth or more negative than that. Thus, when the anode of the first pn junction reaches a first potential at which the first pn junction becomes reversely biased or zero-biased, the first field-effect transistor becomes conductive. In the present embodiment the first potential is Vg1−Vth, and Vth is a negative value when the first field-effect transistor is a p channel type (as discussed in the preceding paragraph) an enhancement type. On the other hand, the cathode 1001 of the photodiode 1000 is also connected with one of the source and drain of the second field-effect transistor, when the cathode 1001 is connected with the first field-effect transistor. The anode potential Van is more negative than Vref and Vth is a positive value when the first field-effect transistor is an n channel type and enhancement type.

First, the second field effect transistor 3000 is turned on so that the cathode 1002 of the photodiode 1000 turns to the read reference potential Vref, and it is turned off. In this state the electric capacitance (mainly, junction capacitance) Canc is charged with Vdd−Vref. The capacitance Canst between the anode of the photodiode and ground is charged with the reference potential Vref.

Next, the capacitance Canc is discharged and the capacitance Canst is further charged by a photocurrent iph from the photodiode 1000 exposed to light, and the anode potential Van increases from Vref to Vdd. After storage time tstr, the second field-effect transistor 3000 is turned on again to be able to output a charge (Canc+Canst)*(Van−Vref) from the other of the source and drain not connected with the photodiode 1000. During switch time ton, an average current, iout= (Canc+Canst)*(Van−Vref)/ton is output on average. The electric charge (Canc+Canst)*(Van−Vref) is referred to as stored optical charge to distinguish it from the stored charge of excess minority carriers.

In a long storage time tstr or with a large photocurrent iph, the anode potential Van exceeds the cathode potential Vdd so that the anode is biased forward relative to the cathode and the photocurrents iph partially start flowing into the photodiode. When all the photocurrents iph flow in the photodiode, the voltage of the photodiode stops varying. This voltage is called as "deep forward voltage". It is called as open circuit voltage in solar cell.

Excess minority carriers are stored in the semiconductor regions of the photodiode and the amount of carriers is approximately proportional to the forward current flowing into the photodiode. To pull out the excess minority carriers, the second field-effect transistor is turned on. However, a time delay occurs from the turning-on of the second field-effect transistor to the photodiode's reversely biased or the anode potential Van reaching the cathode potential Vdd or less. Although it is preferable to reduce the excess minority carriers to zero, it is sufficiently effective to reduce the forward current to the photodiode to about one-tenth of the photocurrent iph or less. That is, in the forward biased photodiode the forward voltage has to be controlled to be smaller than the deep forward voltage by about 60 mV or more. It is most preferable to control the anode-cathode voltage of the photodiode from zero to a reverse bias voltage.

Next, the first field-effect transistor 3010 for the saturation control is described. The first gate potential Vg1 is set to cathode potential Vdd+gate threshold voltage Vth for simplicity. A gate threshold voltage Vth is typically negative and closer to Vref by |Vth| from Vdd. The anode 1002 of the photodiode 1000 is discharged by the photocurrent so that the potential Van varies from Vref to Vdd. This turns on the first field-effect transistor 3010 due to the connection of the anode 1002 and first source 3012 to start bypassing the photocurrent from the source 3012 to the drain 3011. Because of this, the anode potential Van is prevented from exceeding the positive cathode potential Vdd. In other words the anode-cathode voltage of the photodiode 1000 calculated from Van minus Vdd will be never deeply biased by the deep forward voltage.

Figure 3:
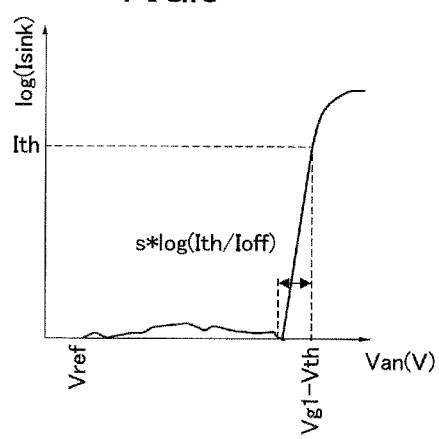
FIG. 3 is a graph to describe the operation of the first field-effect transistor for saturation control.

The gate threshold voltage Vth of the first field-effect transistor is defined to be a gate-source voltage which flows a saturation current of 1 μA between the source and the drain. In the photodiode with light receiving area of 50 μm square or less, the anode-cathode voltage is clamped to about 0V under daytime ambient light. As shown in FIG. 3, a current Isink bypassed by the first field-effect transistor increases exponentially when the anode potential Van approaches Vg1−Vth from Vref and it reaches Ith of 1 μA, for example, at the anode potential Van being Vg1−Vth. Since the off-current value Ioff of the first field-effect transistor can be designed to be in pA level, the amount of current added to an equivalent dark current of the photodiode is smaller than that when the photodiode is connected in parallel with the Shottky diode. While the anode potential Van changes from Vg1−Vth−(0.4 to 0.5V) to Vg1−Vth, the current Isink increases from Ioff to Ith. The change range of Van, 0.4 to 0.5 V is given by s*log (Ith/Ioff) where s is a device parameter as so-called sub-threshold slope.

To keep the anode-cathode voltage in a reverse bias range, the first gate potential Vg1 has to be set to be closer to Vref than Vdd+Vth. Further, to control the saturation of the photocurrent iph of the photodiode 1000 having the light receiving area of larger than 50 μm square under direct sunlight in mid summer, the channel width of the first field-effect transistor 3010 is set to a width W enough to pass the photocurrent in addition to the first gate potential Vg1 set as above. That is, at the photocurrent iph being larger than Ith, the width W is determined by the following expression:

$$W=(iph-Ith)*2L/(\mu Cox(Vg1-Vdd-Vth)^2)$$

where Vg1<Vdd+Vth, L is channel length, Cox is electric capacitance per unit area of gate insulator film.

Figure 4:
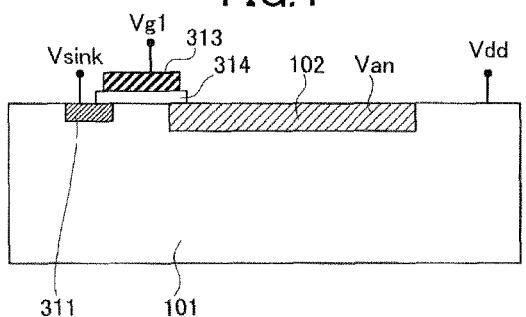
FIG. 4 is a cross section view of the circuit in FIG. 2 excluding a second field-effect transistor by way of example.

FIG. 4 shows a cross section of a simplest example of the photodiode 1000 and the first field-effect transistor 3010 of the photoelectric converter in FIG. 2. The photoelectric converter includes a first semiconductor region 101 of a first conductivity type, a second semiconductor region 102 of a second conductivity type opposite to the first conductivity type. The first pn junction is formed of the junction plane of the first and second semiconductor regions 101, 102. The photodiode 1000 is formed of the second semiconductor region 102 and a portion of the first semiconductor region 101 adjacent to the second semiconductor region within the diffusion length of minority carriers.

It also includes a third semiconductor region 311 of the second conductivity type provided as a first drain of the first field-effect transistor 3010 spaced apart from the second semiconductor region 102. A first gate insulator film 314 of the first field-effect transistor is provided to contact a part of the second and third semiconductor regions 102, 311 and the surface of the semiconductor region 101 therebetween. A first gate 313 thereof is formed to contact the first gate insulator film so that it bridges the second and third semiconductor regions. In the present embodiment the first source of the first field-effect transistor shares the second semiconductor region 102 with the photodiode 1000. The channel thereof is induced or disappears by the electric field of the first gate in the surface of the first semiconductor region between the second and third semiconductor region.

The first semiconductor region can be a semiconductor substrate or an electrically separated region on a semiconductor substrate or an insulated substrate.

To apply the same bias as that in FIG. 2, the first semiconductor region 101 is supplied with the potential Vdd, the third semiconductor region 311 is supplied with the potential Vsink as Vdd+Vth or less (reference voltage Vref or 0V, for example), and the first gate 313 is supplied with Vg1.

Figure 5A:
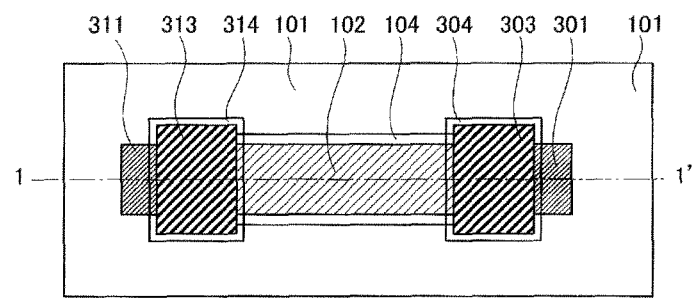
FIG. 5A is a planar view of the circuit in FIG. 4 including a fourth semiconductor region according to one embodiment of the present invention and FIG. 5B is a cross section view of the same.
Figure 5B:
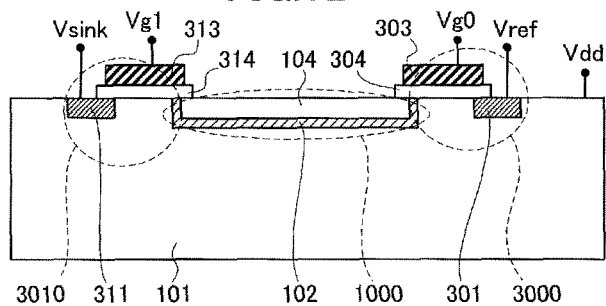

FIGS. 5A, 5B are a planar view and a cross section view of a fourth semiconductor region 104 of the first conductivity type in contact with the second semiconductor region and the second field-effect transistor 3000 additionally disposed in the structure in FIG. 4, respectively. FIG. 5B is a cross section seen from 1 to 1' line in FIG. 5A. A fifth semiconductor region 301 of the second conductivity type is provided in contact with the surface of the first semiconductor region and as spaced apart from the second semiconductor region and is a second drain of the second field effect transistor 3000. A second gate insulator film 304 of the second field-effect transistor 3000 is provided to contact a part of the second and fifth semiconductor regions and the surface of the first semiconductor region therebetween. A second gate 303 of the second field-effect transistor is provided to contact the second gate insulator film 304 and bridge the second and fifth semiconductor areas. The source thereof shares the second semiconductor region with the photodiode 1000 in the present embodiment. The channel thereof is induced or disappears by the electric field of the second gate 303 on the surface of the first semiconductor region between the second and fifth semiconductor regions.

In FIGS. 5A, 5B the fourth semiconductor region 104 can extend to the first semiconductor region from the second semiconductor region. It can be self-aligned with the first and second gates 313, 303 at both ends of the second semiconductor region via the insulator films. The fourth semiconductor region can reduce a dark current and stabilize it. Further, it can increase the anode-cathode capacitance Canc of the photodiode 1000 and increase the upper limit of stored optical charges.

Further, the fifth semiconductor region as the second drain of the second field-effect transistor 3000 is supplied with the reference potential Vref and the second gate 303 (potential Vg0) is supplied with Vdd to turn off the second field effect transistor 3000 and with a potential more negative than Vref+Vth to turn it on (if the transistor 3000 is a p-channel). Stored optical charges can be read as charge or current from the second drain 301 of the second field effect transistor 3000 and the cathode 101 of the photodiode 1000 during the switch time.

A single field effect transistor can be used for the first and second field effect transistors 3010, 3000. The cross section view of the circuit in FIG. 2 excluding the second field effect transistor 3000 is exact the same as that in FIG. 4. To charge the anode-cathode electric capacitance Canc of the photodiode 1000 with Vdd−Vref first, the potential Vref is supplied to the first drain 311, and a potential more negative than Vref+Vth is supplied to the first gate 313 of the first field-effect transistor. Next, during the optical charge storage phase, the potential of the first gate 313 does not need to be changed, and a potential Vg1 (≤Vdd+Vth) is supplied to the first gate. To read the stored optical charges or read them as a current, the potential more negative than Vref+Vth is supplied to the first gate 313 again. Charge or current can be read from the first drain 311 or the cathode 101 of the photodiode 1000 by connecting a sense amplifier with a field-effect transistor to connect or activate it in synchronization with the change in the potential to the first gate 313. The connection or activation to the sense amplifier by the field effect transistor is not necessary for reading the charge or current from the cathode 101 of the photodiode. Note that activation refers to turning off a connector of the sense amplifier to a Vref potential in a read phase, otherwise the input thereof is connected with a Vref potential.

Second Embodiment

Figure 6:
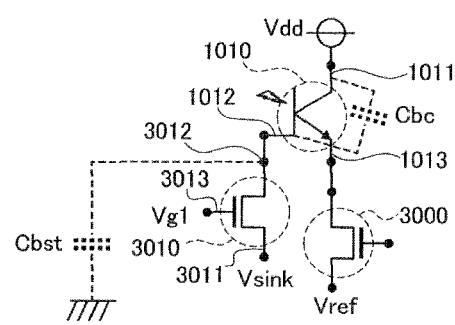
FIG. 6 is an equivalent circuit diagram in which the photoelectric converter according to the present invention is applied to a photo transistor.

FIG. 6 shows an example of the first pn junction which is applied as a base-collector junction of a photo transistor 1010. A source 3012 of the first field-effect transistor is connected to a base 1012 of the photo transistor 1010 to control the saturation of the base-collector junction. The first gate is supplied with the potential Vg1 while the first drain 3011 is supplied with the second potential Vsink which is Vdd+Vth or less such as Vref or 0V. The collector 1011 of the photo transistor is supplied with Vdd. Here, the first potential is Vg1−Vth and Vg1 is set to be equal to or more negative (when npn transistor is used, equal to or more positive when pnp transistor is used) than the collector potential (Vdd). An emitter 1013 is connected to the source or drain of the second field effect transistor 3000 and Vref is supplied to the other of the source and drain.

First, the second field effect transistor 3000 is turned on to set the emitter 1013 of the photo transistor 1010 to have a read reference potential Vref, and it is turned off. Now, an electric capacitance Cbc (mainly, junction capacitance) between the base and collector of the photo transistor 1010 is charged with Vdd−Vref−Vbe. An electric capacitance Cbe between the base and emitter of the photo transistor 1010 is charged with Vbe, and a capacitance Cbst between the base and ground is charged with Vref+Vbe. Vbe is a forward voltage between the base and emitter when a photocurrent flows from the base to the emitter. The photocurrent iph is generated when the collector or base is exposed to light, and amplified and output from the emitter and collector of the photo transistor 1010.

Then, the electric capacitance Cbc is discharged and the capacitance Cbst is further charged by the photocurrent iph from the base 1012 of the photo transistor 1010 exposed to light, increasing the base potential Vb from Vref+Vbe to Vdd. After the storage time tstr, the second field effect transistor 3000 is switched on again to be able to read an amplified charge=$(h_{FE}+1)(Cbc+Cbst)*(Vb-Vref-Vbe)$ from the other of drain and source thereof, where $h_{FE}$ is amplification factor of the photo transistor 1010. During switch time ton, mean amplified current iout=$(h_{FE}+1)(Cbc+Cbst)*(Vb-Vref-Vbe)/ton$ is read. $(Cbc+Cbst)*(Vb-Vref-Vbe)$ is referred to as stored optical charges and distinguished from the stored charges of excess minority carriers. Note that the electric capacitance Cbe between the base and emitter of the photo transistor 1010 remains at the voltage Vbe so that it is not considered for the readout.

The saturation of the pn junction can be controlled by supplying the first gate the potential Vg1 to the first gate 3013 and the second potential Vsink to the first drain, as in the case of the photodiode.

Figure 7:
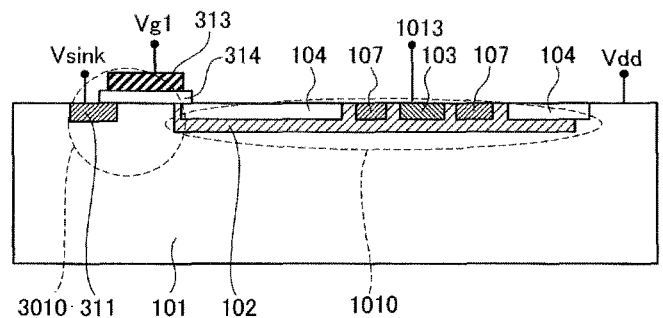
FIG. 7 is a cross section view of the circuit in FIG. 6 excluding a second field-effect transistor.

Next, FIG. 7 is a cross section view of the photo transistor 1010 and the first field-effect transistor 3010 of the photoelectric converter in FIG. 6. A part of the first semiconductor region 101 of the first conductivity type functions as the collector of the photo transistor 1010. The second semiconductor region 102 of the second conductivity type is provided in contact with the first semiconductor region 101 and functions as the base of the photo transistor 1010. A six semiconductor region 103 of the first conductivity type is provided in contact with the second semiconductor region and functions as the emitter of the photo transistor 1010. The first pn junction is formed of the junction plane between the first and second semiconductor regions 101, 102. A photocurrent iph is generated when the second semiconductor region 102 and a portion of the first semiconductor region close thereto (within diffusion length of minority carriers) are exposed to light, and acquired from the second semiconductor region 102 as the base.

The fourth semiconductor region 104 of the first conductivity type is self-aligned with the first gate in the surface of the second semiconductor region 102. It extends to the first semiconductor region 101 in the surface where the second semiconductor region 102 contacts the first semiconductor region 101. The fourth semiconductor region 104 is separated from the sixth semiconductor region 103. In order to prevent a leak current path and maintain a constant current amplification factor between the fourth and sixth semiconductor regions 104, 103, a seventh semiconductor region 107 of the second conductivity type can be provided in contact with the surface of the second semiconductor region therebetween. The seventh semiconductor region 107 possesses higher impurity concentration than the second semiconductor region.

A third semiconductor region 311 of the second conductivity type is provided spaced apart from the second semiconductor region 102 and is the first drain of the first field-effect transistor 3010. A first gate insulator film 314 thereof is provided to contact a part of the second and third semiconductor region and the surface of the first semiconductor region therebetween. A first gate 313 thereof is provided to contact the first gate insulator film to bridge the second and third semiconductor regions. The first source shares the second semiconductor region 102 with the photo transistor in the present embodiment. The channel thereof is induced or disappears by the electric field of the first gate in the surface of the first semiconductor region between the second and third semiconductor regions. The first semiconductor region can be a semiconductor substrate or an electrically isolated region on a semiconductor substrate or an insulated substrate.

The technique according to the present embodiment is applicable to a photo-transistor not including the second field-effect transistor 3000. The cross section view of the circuit in FIG. 6 excluding the second field effect transistor 3000 is exact the same as that in FIG. 7. To charge the base-collector electric capacitance Cbc of the photodiode 1010 with Vdd−Vref−Vbe and the capacitance Cbst with Vref first, the potential Vdd is supplied to the collector 1011, and Vref is supplied to the emitter 1013. Next, to accumulate optical charges in the capacitances Cbc, Cbst, the emitter 1013 is switched to a potential of Vdd or more. The base-emitter junction is reversely biased and the base is placed in a floating state so that the capacitance Cbc is discharged and the capacitance Cbst is charged by the photocurrent flowing from the base. The saturation can be thus controlled by supplying the potential Vsink to the first drain 311 of the first field-effect transistor and the potential Vg1 (≤Vdd+Vth) to the first gate.

To read the stored optical charges again, the potential of the emitter 1013 is returned to Vref. Charge or converted current can be read from the emitter 1013 or the collector 1011. The switch connection or activation of the sense amplifier is not necessary for reading the charge or current from the collector 1011.

In the above, the magnitude relation of potentials and polarity for the field-effective transistor as p-channel are described. For an n-channel field-effect transistor, they will be reverse.

Figure 8:
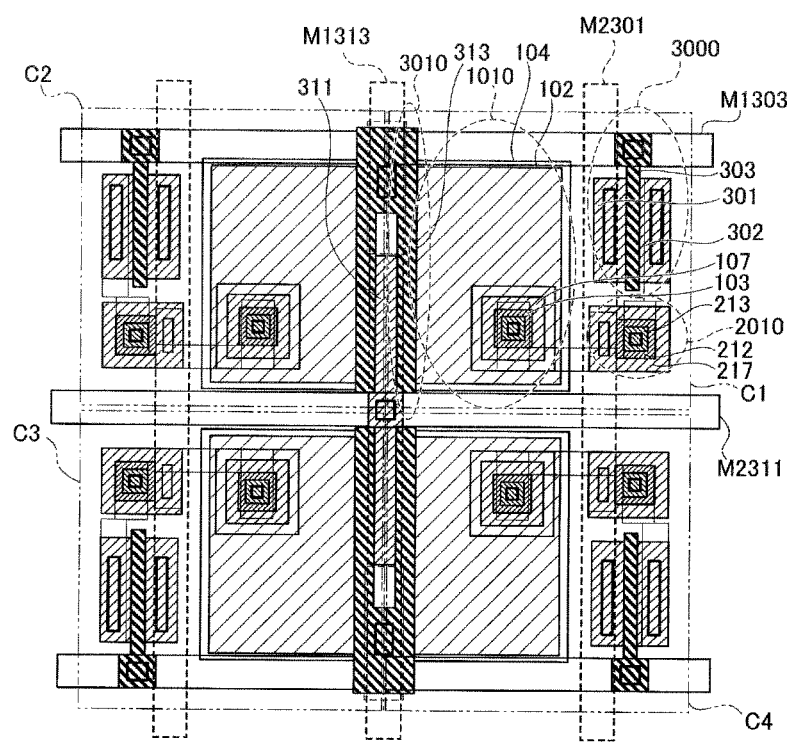
FIG. 8 shows an example of cell structure in which the photoelectric converters according to one embodiment of the present invention are arranged in array.

FIG. 8 shows an example of the photoelectric converter array in which four unit cells C1, C2, C3, C4 as a group are vertically and horizontally arranged. The area-efficient array can be structured by sharing an interconnection M2311 of the first drain 311 and an interconnection M1313 of the first gate 313 of the saturation-controlling first field-effect transistor 3010 with neighboring cells. Although the interconnection M2311 and M1313 intersect with each other in the drawing, the array is in a double-layer interconnection structure and the two interconnections are insulated each other by an insulator film so that they will be never electrically short-circuited.

Figure 9:
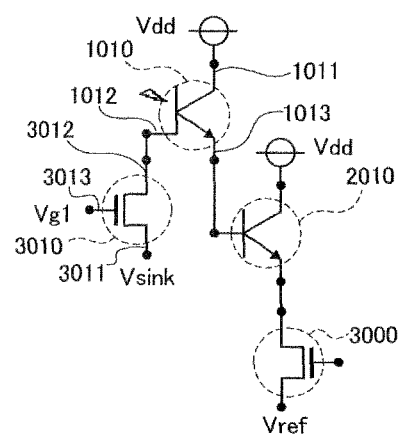
FIG. 9 is an equivalent circuit diagram of the cell in FIG. 8.

The array in FIG. 8 includes a second bipolar transistor 2010 for amplification in addition to the photo-transistor in each cell. The fifth semiconductor region 103 as the emitter of the photo-transistor 1010 is connected to a semiconductor region 212 of the second conductivity type as the base of the second bipolar transistor 2010 via a semiconductor region 217 of the second conductivity type. A semiconductor region 213 of the first conductivity type as the emitter of the second bipolar transistor 2010 is connected to one 302 of the source and drain of the second field-effect transistor. An equivalent circuit diagram of a single cell in FIG. 8 is shown in FIG. 9.

Third Embodiment

Figure 10:
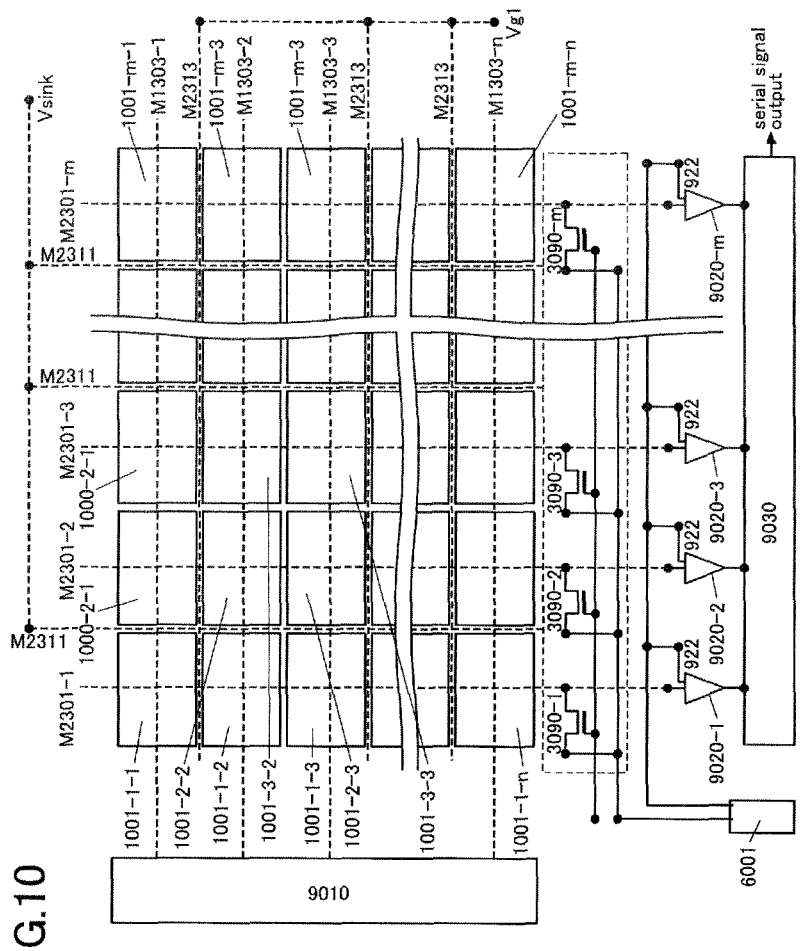
FIG. 10 shows an example of an imaging device to which the photoelectric converter array according to one embodiment of the present invention is applied.

FIG. 10 shows an example of the structure of an imaging device incorporating the photoelectric converter array according to one embodiment of the present invention. The imaging device comprises the photoelectric converter array as above, plurality of first interconnections M1303-1, M1303-2, ..., M1303-n each connected to the second gates 303 of the second field-effect transistors of the photoelectric converters arranged horizontally or in X direction, a Y drive circuit 9010 to scan the first interconnections, plurality of second interconnections as output lines M2303-1, M2303-2, ..., M2303-m each connected to the others 301 of the sources and drains of the second field-effect transistors of the photoelectric converters arranged vertically or in Y direction, current or charge sense circuits 9020 with first input terminals connected to the second interconnections, and third field-effect transistors 3090-1, 3090-2, ..., 3090m for setting reference potential. The current or charge sense circuits 9020 are of a differential input type including second input terminals 922 for the reference potential. With use of a single current or charge sense circuit, scanning field-effect transistors are connected to the output lines sequentially switch one of the output lines to the single current or charge sense circuit.

The second input terminals 922 of the sense circuits 9020 are supplied with the reference potential Vref from a reference potential supplier 6001. One of the source and drain of each of the third field-effect transistors 3090-1, 3090-2, ..., 3090-m is connected to the second interconnections and the other thereof is supplied with the reference potential Vref from the reference potential supplier 6001. The output of the sense circuits are converted to a serial signal by a serial-parallel converter circuit 9030.

The output lines are charged with the reference potential Vref by the third field-effect transistors 3090 after sensing when needed while all the second field-effect transistors are off. A third interconnection M2313 of the gate of the first field-effect transistor 3010 for saturation control is supplied with the first gate potential Vg1 equal to or more negative than Vdd+Vth by a potential generator circuit in or from outside a chip. A fourth interconnections M 2311 of the drain 311 of the first field-effect transistor for saturation control 3010 is supplied with the second potential Vsink.

The photoelectric converter according to the above embodiments can reduce the storage of excess minority carriers in the photoelectric conversion elements to be able to decrease a switching delay and improve the read speed. Further, in the photoelectric converter array a leakage of photocurrent from neighboring cells can be prevented. This results in preventing image blurs and equivalent degradation in resolution of the imaging device incorporating the photoelectric converter array.

The present invention can broaden the field of application of a sensor, office machine, and scientific instrument using photoelectric conversion, and abate a switching delay or image blurs of a high-sensitive photoelectric converter or an imaging device used partially in an ambient condition of a large optical intensity and luminance.

Although the present invention has been described in terms of exemplary embodiments, it is not limited thereto. It should be appreciated that variations or modifications may be made in the embodiments described by persons skilled in the art without departing from the scope of the present invention as defined by the following claims.

The invention claimed is:

1. A photoelectric converter comprising:
    a first pn junction having a photoelectric conversion function and comprised of at least two semiconductor regions of different conductivity types; and
    a first field-effect transistor including a first source, a first drain, and a first insulated gate, the first source connected with one of the semiconductor regions, in which when either of the semiconductor region is exposed to light, a photocurrent flows in the first pn junction, wherein:
    the first field-effect transistor includes a same conductivity type channel as that of the one of the semiconductor regions;
    the first drain of the first field-effect transistor is supplied with a second potential at which the first pn junction is zero-biased or reverse-biased relative to the potential of the other of the semiconductor regions; and
    by supplying, to the first insulated gate, a first gate potential which makes the first field-effect transistor conductive when the first source reaches a first potential at which the one of the semiconductor regions becomes zero-biased or reverse-biased relative to the other of the semiconductor regions, the photoelectric converter is configured to control saturation of the first pn junction not to be biased by a deep forward voltage, even when either of the two semiconductor regions is exposed to light.

2. A photoelectric converter according to claim 1, wherein an absolute value of a difference between the first gate potential and the potential of the other of the semiconductor regions is equal to or larger than an absolute value of a gate threshold voltage of the first field-effect transistor.

3. A photoelectric converter according to claim 1, wherein the first pn junction is a base-collector junction of a first bipolar transistor; and
    the base of the first bipolar transistor is connected with the source of the first field-effect transistor.

4. A photoelectric converter according to claim 1, further comprising
    a second field-effect transistor including a second source, a second drain, and a second gate, wherein
    one of the second source and second drain is connected with an anode of the pn junction; and electric information is obtained from the other of the second source and second drain, on supplying a conductive signal at the second gate to make the second field-effect transistor conductive.

5. A photoelectric converter according to claim 3, further comprising
    a second field-effect transistor including a second source, a second drain, and a second gate, wherein
    one of the second source and second drain is connected with an emitter of the first bipolar transistor, and electric information is obtained from the other of the second source and second drain, on supplying a conductive signal at the second gate to make the second field-effect transistor conductive.

6. A photoelectric converter according to claim 3, further comprising
    a second field-effect transistor including a second source, a second drain, and a second gate; and
    a single or plural second bipolar transistors, wherein
    an emitter of the first bipolar transistor is connected with a base of the single or plural bipolar transistors;
    a base and an emitter of the plural bipolar transistors are connected with each other;
    an emitter not connected with the base is connected with one of the second source and second drain, and electric information is obtained from the other of the second source and second drain, on supplying a conductive signal at the second gate to make the second field-effect transistor conductive.

7. A photoelectric converter comprising:
    a first semiconductor region of a first conductivity type;
    a second semiconductor region of a second conductivity type opposite to the first conductivity type, in contact with the first semiconductor region;
    a third semiconductor region of the second conductivity type, provided in contact with the first semiconductor region and spaced apart from the second semiconductor region;
    a first insulator film provided on a surface of the first semiconductor region between the second and third semiconductor region; and
    a first gate provided on the first insulator film to bridge the second and third semiconductor region, in which when the second semiconductor region or a part of the first semiconductor region close to the second semiconductor region exposed to light, a photocurrent flows between the first and second semiconductor regions, wherein
    the third semiconductor region is supplied with a second potential at which the second semiconductor region becomes zero-biased or reverse-biased relative to the first semiconductor region, and when the second semiconductor region turns to a first potential, at which the second semiconductor region becomes zero-biased or reverse biased relative to the first semiconductor region, the photoelectric converter is configured to control saturation of the second semiconductor region not to be biased by a deep forward voltage by supplying, to the first gate, a first gate potential to induce a channel or a current path on a surface of the first semiconductor region under the first gate, even when the second semiconductor region or a portion of the first semiconductor region close to the second semiconductor region is exposed to light.

8. A photoelectric converter according to claim 7, further comprising
    a fourth semiconductor region of the first conductivity type provided to cover an upper part of the second semiconductor region and be self-aligned with the first gate.

9. A photoelectric converter according to claim 7, further comprising a fifth semiconductor region of the first conductivity type is in contact with the second semiconductor region, so that a current having flowed through the second semiconductor region is amplified through the first or fifth semiconductor regions.

10. A photoelectric converter array comprising:
a plurality of the photoelectric converters according to claim 4, arranged in first and second directions intersecting with each other;
a plurality of first interconnections extending in the first direction;
a plurality of second interconnections extending in the second direction;
a third interconnection to supply the first gate potential; and
a fourth interconnection to supply the second potential, wherein:
the first to fourth interconnections are insulated with one another; and
the second gate of the second field-effect transistor is connected with one of the first interconnections extending in the first direction; and
the other of the second source and second drain of the second field-effect transistor is connected with one of the second interconnections extending in the second direction.

11. A photoelectric converter array according to claim 10, wherein the first drain is arranged to have a common portion in neighboring photoelectric converters.

12. An imaging device comprising:
the photoelectric converter array according to claim 10;
a drive circuit to scan the first interconnections;
a current or charge sense circuit connected with the second interconnections;
a third field-effect transistor or potential setting connected with the second interconnections at one of a source and a drain;
a reference potential supplier connected with the other of the source and drain of the third field-effect transistor;
a first gate potential supplier connected with the third interconnection; and
a second potential supplier connected with the fourth interconnection, wherein
the current or charge sense circuit is of a differential type, having a first input terminal connected with the second interconnections and a second input terminal, and supplied with a reference potential at the second input terminal.

13. An imaging device according to claim 12, wherein the third field-effect transistor is configured to supply a reference potential to the second interconnections after the sense circuit completes sensing and before the second field-effect transistor is turned off.

* * * * *